United States Patent [19]

Murayama

[11] 4,219,172
[45] Aug. 26, 1980

[54] HOLDER FOR ELECTRONIC AND ELECTRICAL PARTS

[75] Inventor: Hiroo Murayama, Hiroshima, Japan

[73] Assignee: Nifco, Inc., Tokyo, Japan

[21] Appl. No.: 919,092

[22] Filed: Jun. 26, 1978

[51] Int. Cl.² .............................................. F16M 13/00
[52] U.S. Cl. ............................... 248/27.3; 248/221.4; 174/138 G; 361/403; 248/310
[58] Field of Search .............. 248/27.3, 50, 73, 221.4, 221.3, 231.1; 174/138g; 361/403
[58] Field of Search ......................................... 361/403

[56] References Cited

U.S. PATENT DOCUMENTS

| | | | |
|---|---|---|---|
| 2,592,031 | 4/1952 | Harding | 248/231.1 |
| 2,904,617 | 9/1959 | King | 174/138 G |
| 2,938,698 | 5/1960 | Johnson | 248/314 |
| 3,035,802 | 5/1962 | Wyman et al. | 248/229 |
| 3,135,488 | 6/1964 | Leonard | 248/50 |
| 3,253,084 | 5/1966 | Taylor | 174/138 G |
| 3,601,777 | 8/1971 | Norton | 174/138 G |

FOREIGN PATENT DOCUMENTS 2377110  9/1978  France ..................................... 361/403

Primary Examiner—William H. Schultz
Attorney, Agent, or Firm—Jack R. Halvorsen; Robert W. Beart

[57] ABSTRACT

A holder comprises a leading portion adapted to retain in position thereon an electronic/electric part, a base portion adapted to be secured to a distributing base panel and a shank portion serving to interconnect the leading portion with the base portion and having a hole pierced therethrough for guiding the lead wire of the electronic/electric part to the lower side of the base portion. The holder permits a given electronic/electric part which is set in position on the leading portion to be securely retained at a distance from the distributing base panel, with the base portion fastened to the base panel and the lead wire of the part passed through the hole and connected to the prescribed point of connection on the base panel.

4 Claims, 8 Drawing Figures

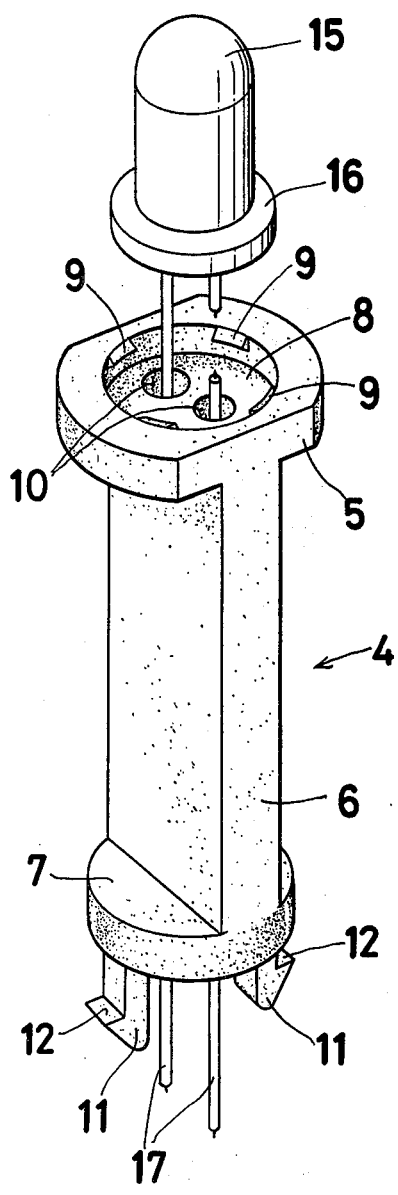
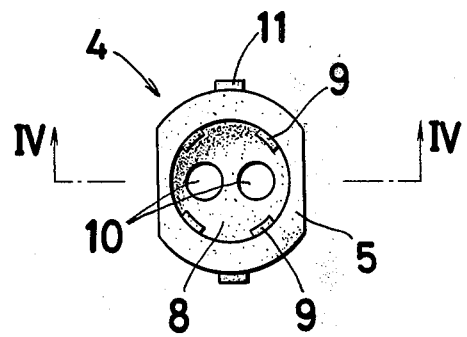
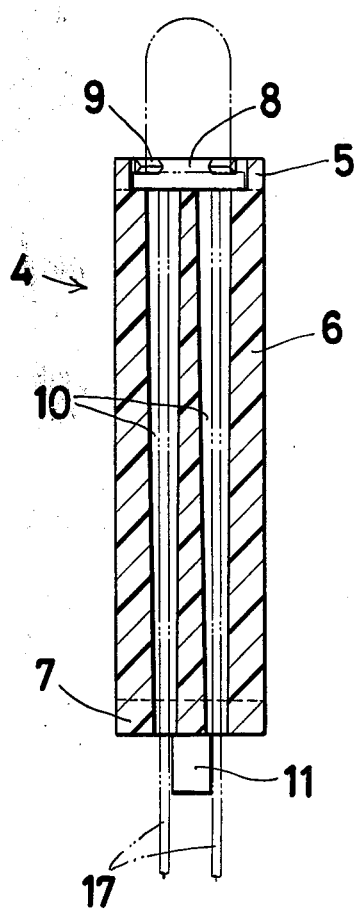
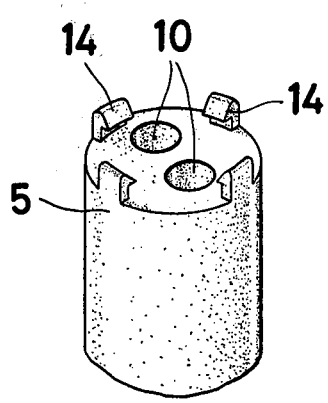

HOLDER FOR ELECTRONIC AND ELECTRICAL PARTS

BACKGROUND OF THE INVENTION

This invention relates to a holder for securely retaining in position an electronic or electrical part which is designed to be held in position at a distance from a circuit board or other object to which it is electrically connected.

Electronic and electric parts which are used in ordinary electric appliances are generally disposed on circuit boards so as to permit effective electric connection therebetween. Some of these parts, particularly lamps, transistor elements, photo-diodes, photo-transistors, etc., are often supported by the chassis or other kind of support plate etc. at a position spaced apart from the circuit board. In the case of transistors, for example, it has heretofore been customary for the transistor to be supported on the circuit board by its lead wires without additional support. Light-emitting elements and other parts designed for attachment to separate supporting plates have, on the other hand, been electrically connected with the circuit board with their lead wires loosely extended.

In the conventional method of supporting a transistor on the circuit board by its lead wires, there are numerous disadvantages in addition to the obvious disadvantage of the unstability of the lead wire disposition: the lead wires may short-circuit, interfere with other neighboring parts or sustain breakage and unexpected troubles may result from the exposure of the circuit board to external shocks. And in the case of the conventional method fastening a light-emitting element onto a separate supporting plate with its lead wire electrically connected with the circuit board, there are entailed disadvantages that the lead wire from the part must be given ample length to allow for freedom of motion during possible disassemblage of the electric appliance, that, in the worst case, the lead wire may fail to find a space between the base panel and the supporting plate, that the lead wire may possibly interfere with other adjacently located parts and that the expense of the part itself may be consequently increased to a considerably higher level. There is also the great disadvantage that the work involved in fastening the part to the supporting plate is quite complicated.

An object of the present invention is to provide a holder formed integrally of a plastic material in a construction such that it permits an electronic or electrical part to be securely held in position at a prescribed distance from the surface of the distributing base panel, gives it necessary protection, prevents it from interfering with other parts and enjoys advantageous workability.

SUMMARY OF THE INVENTION

To accomplish the object described above according to the present invention, there is provided a plastic holder for the secure retention of electronic and electrical parts possessing a flange, which holder comprises a leading portion possessing means for engagement with the flange of the part subjected to retention, a base portion possessing fastener means adapted for fast engagement with a base panel, a shank portion integrally connected at one end with the leading portion and at the other end with the base portion, and a hole pierced longitudinally through the shank portion from the leading portion side through the base portion side.

The holder of the present invention enables an electronic or electrical part to be retained securely in position at a prescribed distance from the surface of a circuit board by preparatorily perforating the circuit board to form therein an opening for engagement with the fastener means of the base portion of the holder, causing the electronic or electrical part to be fastened in position on the leading portion of the holder with the aid of the engaging means, allowing the lead wire from the part to pass through the hole pierced through the shank portion of the holder and finally fastening the holder to the base panel through fast engagement of the opening in the base panel with the fastener means.

The part can be securely retained in position at a prescribed distance from the circuit board by having the electronic or electrical part fastened in position on the leading portion of the holder and then bringing the holder into fast engagement with the circuit board. The desired secure retention of the part can be conveniently obtained by calculating the distance from the circuit board to the position prescribed for the retention of the part at the stage of design of the electric appliance for which the holder is intended and then selecting from among holders of this invention having varying lengths, the particular holder of the length that exactly conforms with the distance calculated in advance. Since the electronic or electrical part is supported in position by its flange and the joint between the part and its lead wire is consequently protected against impacts, otherwise possible troubles of lead wire breakage and part fracture can be prevented and the unwanted contact between bare wires can be precluded. Lamps and photo-diodes which by nature are designed for direct attachment to a separate chassis can be securely retained on one and the same circuit board by means of holders of the present invention. Thus, the present invention brings about simplification of circuitry and contributes to facilitation of the work involved in the assemblage and disassemblage of the electric appliance using the holders of the invention.

The other objects and characteristics of this invention will become apparent from the description to be given in detail hereinafter with reference to the accompanying drawings.

BRIEF DESCRIPTION OF THE DRAWINGS

FIG. 2 is a perspective view of one preferred embodiment of the holder of this invention for use with an electronic or electrical part.

FIG. 3 is a plan view of the holder of FIG. 2.

FIG. 4 is a sectioned view taken along the line IV—IV of FIG. 3.

FIG. 8 is a perspective view illustrating still another preferred embodiment of the holder of the present invention.

DESCRIPTION OF THE PREFERRED EMBODIMENTS

Figure 1:
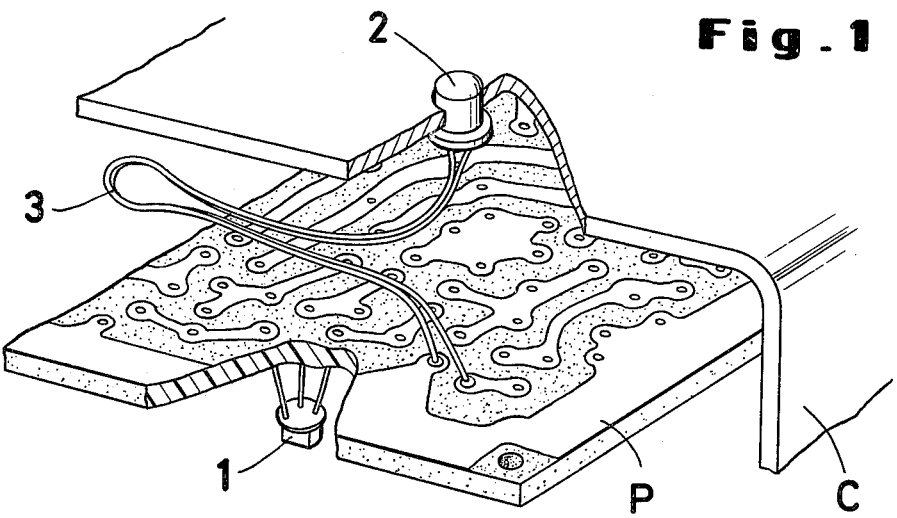
FIG. 1 is a partially cutaway perspective view illustrating the state of the wiring and electronic or electrical parts generally found in electric appliances.

Most electronic and electrical parts in ordinary electric appliances in general use are directly connected to and fastened in position on circuit boards. For the convenience of wiring, the practice of planting necessary parts on one (obverse) side of a printed-circuit base panel as illustrated in FIG. 1 has found widespread acceptance in the electronic/electric industry. Most electronic and electrical parts have their lead wires passed through fine holes perforated in a printed circuit board, and led to and soldered at their respective points of connection on conductors which are printed on the reverse side of the board. For a resistor, a condenser, etc., the length of the lead wires may be decreased as much as possible. In the case of a semiconductive part 1, however, it is desirable to make the lead wires as long as possible so that the part can be kept unaffected by the heat of soldering. If this semiconductive part happens to be a photo-diode or the like, there is a necessity of having the part disposed at an unusually large distance from the surface of the distributing base panel. The frequency with which such undesirable phenomena as short-circuiting, wire breakage and interference with other neighboring parts are induced by such extended lead wires increases with the increasing length given to the lead wires. A photo-diode or photo-transistor 2 is sometimes fastened in position on a supporting plate such as a chassis C which is spaced some distance from the circuit board, with a lead wire 3 serving to establish the necessary electric connection. In most cases, the lead wire of this nature is given ample extra length as illustrated so as to facilitate the assemblage and disassemblage of the electric appliance.

Use of the holders of the present invention helps to overcome the aforementioned disadvantages, eliminate wasted time and labor, facilitate the work of wiring and realize secure retention of parts in position.

As illustrated in FIGS. 2–4, the holder of the present invention is integrally formed of a plastic material in a construction comprising a leading portion 5, a shank portion 6, and a base portion 7.

The leading portion 5 is incised with a retaining hole 8 for accommodating a flange 16 of an electronic or electrical part such as a photo-diode 15 designed to be disposed in position at a distance from the circuit board. This retaining hole 8 is provided on the inner circular wall thereof with spaced projecting catches 9 serving to catch hold of the flange 16 of the part. These projecting catches have a triangular cross section and they protrude inwardly from the inner circular wall of the retaining hole 8 of a size capable of receiving into tight engagement the flange 16 of the part. At the time that the flange 16 of the part is being received into the retaining hole 8, therefore, the advance of the flange 16 into the depth of the hole is obstructed by the catches 9. Since the projecting catches are a part of the holder integrally formed of a plastic material and, therefore, possess the flexibility of the plastic material, the flange 16 of the part can easily be pushed past the catches into the depth of the retaining hole. The base portion 7 has a flat bottom surface to ensure stable retention of the entire holder and also possesses fastener means 11 adapted for fast engagement of the holder with the circuit board. These fastener means 11 are each in the shape of a hook containing a shoulder part 12. They are brought into hooked engagement with the edge of an opening 18 perforated in advance in the circuit board P by causing the shoulder parts to be advanced forcibly past the opening 18 (FIG. 5).

The shank part 6 serves to interconnect integrally the leading portion 5 and the base portion 7 and contains internal through-holes 10 extending from the leading portion to the base portion. These through-holes 10 serve the dual purpose of separating the two component lines of the lead wire 17 and guiding them to their respective points of connection 19 on the distributing base panel P. The number of these through holes has only to be identical with that of the component lines of the lead wire of the relevant part. The shape in which the shank part 6 is formed is not critical insofar as the shank part fulfils its purpose of interconnecting the leading portion and the base portion and providing necessary through holes for the guidance of the lead wire. Holders of various heights can be obtained by giving this shank part various lengths conforming with the various prescribed distances between the circuit board P and the chassis C. In the case of holders which are used for the only purpose of retaining ordinary semiconductors, only a moderate height is satisfactory.

Now, a typical manner of fastening an electronic or electrical part with a holder of the foregoing construction will be described. First, the individual lead wires 17 from the part are inserted into the through-holes which open into the leading portion 5 of the holder and the flange 16 of the part is pushed into the retaining hole 8 (FIG. 2). The holder which has the part fastened in position on the leading portion as described above is attached fast to the circuit board by having the fastener means 11 of the base portion inserted past and brought into hooked engagement with the opening 18 perforated in advance in the circuit board P. Thereafter, the secure attachment of the part to the circuit board is completed by causing the leading ends of the lead wire extending from the through holes of the base portion to be soldered at their respective points of connection to the base panel.

Figure 5:
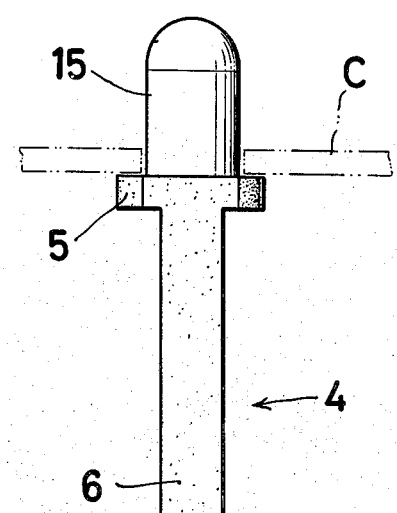
FIG. 5 is a sectioned view of the holder of FIG. 2 illustrating the condition in which the holder is used for holding a part in position thereon.

Use of the holder of the present invention proves particularly advantageous where a light-emitting element 15 is desired to be visible from the outside of a chassis C which is located at a distance from the circuit board P as illustrated in FIG. 5. The secure attachment of the light-emitting element in this case is accomplished by a simple procedure of first fastening the light-emitting element 15 through the medium of the holder having a suitable length to the base panel P, then allowing the light-emitting element to protrude from the hole perforated in advance in the chassis C and finally disposing fast the base panel in position.

Figure 6:
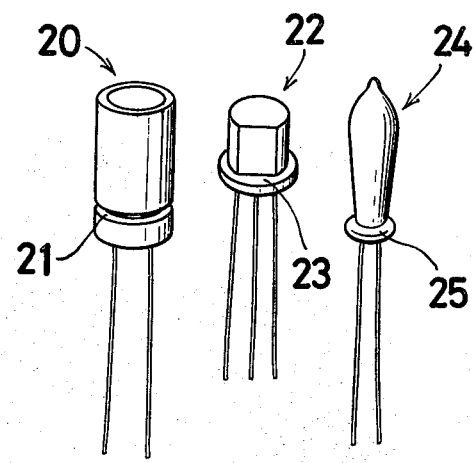
FIG. 6 is an explanatory diagram illustrating electronic and electric parts for which the holder of the present invention can be used.

The parts for which the holders of the present invention are usable are not limited to photo-diodes. They can be used with parts such as, for example, condensers 20 possessing a groove 21, transistors 22 possessing a flange 23 and lamps 24 possessing a bulged portion 25 which incorporate portions capable of being caught hold of by the engaging means of the leading portion of the holder (FIG. 6).

Figure 7:
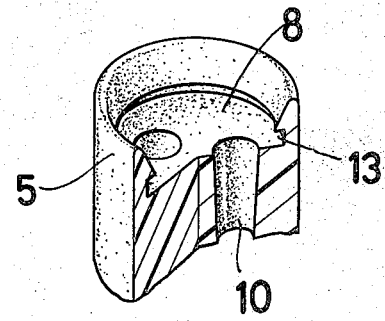
FIG. 7 is a partially cutaway perspective view illustrating another preferred embodiment of the holder of this invention.

FIGS. 7–8 illustrate other preferred embodiments of the engaging means at the leading portion 5 for catching hold of the flange of the electronic or electrical part. The leading portion 5 of the holder illustrated in FIG. 7 has a groove 13 formed in the entire inner side wall of the retaining hole 8 adapted to accommodate the flange of the part, so that the part can be brought into very powerful retention by causing the flange thereof to be forcibly pushed into the groove. The means which the holder illustrated in FIG. 8 possesses for the engagement with the flange of the part consists of hook-shaped engaging catches 14 protruding from the upper surface of the leading portion 5. They are adapted for the flange of the part to be brought into hooked engagement therewith. Since these engaging means are formed of the same plastic material as the rest of the integrally formed holder and, therefore, possess the flexibility proper to the material, they permit the parts to be readily brought into engagement and consequent secure retention.

When the holder of the present invention is used for retaining a semiconductor possessing a high heat-generating property, it enjoys an additional advantage of accelerating the dissipation of the heat being generated within the semiconductor during its service. If the holder is expected to provide positive effect of heat dissipation, then it may be provided on the shank portion thereof with a multiplicity of fins, not shown.

Thus, incorporation of holders of the present invention into the circuit boards helps to reduce the labor involved in wiring, simplify the mechanism of wire distribution, improve the reliability of circuit performance and protect the parts in use.

I claim:

1. A one-piece dielectric plastic holder for the secure retention of an electronic or electrical part having integral retention means, said holder comprises a leading portion including resilient snap engaging means forming a recess for acceptance and engagement with the retention means of the part subjected to retention, a base portion including integral resilient fastener means carrying shoulder means adapted for fast engagement with an apertured base panel, a shank portion integrally connected at one end with said leading portion and at the other spaced end with said base portion, and two or more holes extending longitudinally through said shank portion from said leading portion end through said base portion end.

2. The holder according to claim 1 wherein the engaging means of the leading portion comprises a plurality of flexible projections formed on the inner side wall of a retaining hole incised in the upper side of the leading portion opposite to its connection to said shank.

3. The holder according to claim 1 wherein the engaging means of the leading portion comprises a groove formed in the entire inner side wall of a retaining hole incised in the upper side of the leading portion opposite to its connection to said shank.

4. The holder according to claim 1 wherein the engaging means of the leading portion comprises a plurality of hook-shaped engaging catches protruding from the upper side of the leading portion opposite to its connection to said shank.

* * * * *